US009715929B2

(12) United States Patent
Wells et al.

(10) Patent No.: US 9,715,929 B2
(45) Date of Patent: *Jul. 25, 2017

(54) SEMICONDUCTOR MEMORY DEVICES INCLUDING A MEMORY ARRAY AND RELATED METHOD INCORPORATING DIFFERENT BIASING SCHEMES (71) Applicant: Ovonyx Memory Technology, LLC, Alexandria, VA (US)

(72) Inventors: David H. Wells, Boise, ID (US); Jun Liu, Boise, ID (US)

(73) Assignee: Ovonyx Memory Technology, LLC, Alexandria, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/165,800

(22) Filed: May 26, 2016

(65) Prior Publication Data

US 2016/0276028 A1 Sep. 22, 2016

Related U.S. Application Data (60) Continuation of application No. 14/702,330, filed on May 1, 2015, now Pat. No. 9,361,979, which is a
(Continued)

(51) Int. Cl.
*G11C 5/06* (2006.01)
*G11C 13/00* (2006.01)
(Continued)

(52) U.S. Cl.
CPC ........... *G11C 13/0069* (2013.01); *G11C 5/02* (2013.01); *G11C 8/10* (2013.01); *G11C 11/16* (2013.01);
(Continued)

(58) Field of Classification Search
CPC ........... G11C 13/0069; G11C 13/0004; G11C 13/0007; G11C 13/004; G11C 13/0023;
(Continued)

(56) References Cited

U.S. PATENT DOCUMENTS

| 6,501,111 | B1 | 12/2002 | Lowrey |
| 6,778,421 | B2* | 8/2004 | Tran ........................ G11C 11/16 365/100 |
| 6,795,338 | B2 | 9/2004 | Parkinson et al. |
| 6,882,553 | B2 | 4/2005 | Nejad et al. |
| 7,359,227 | B2 | 4/2008 | Dennison et al. |
| 7,911,823 | B2 | 3/2011 | Futatsuyama et al. |
| 8,144,506 | B2 | 3/2012 | Wells et al. |
| 9,025,370 | B2* | 5/2015 | Wells ........................ G11C 5/02 365/148 |
| 9,361,979 | B2* | 6/2016 | Wells ........................ G11C 5/02 |
| 2001/0028580 | A1 | 10/2001 | Mullarkey |
| 2003/0027378 | A1* | 2/2003 | Kleveland .............. B82Y 10/00 438/131 |
| 2006/0056265 | A1 | 3/2006 | Bedeschi et al. |
| 2006/0120136 | A1 | 6/2006 | Dennison et al. |
| 2008/0025132 | A1 | 1/2008 | Fasoli et al. |
| 2008/0123398 | A1 | 5/2008 | Nirschl et al. |
| 2008/0273365 | A1 | 11/2008 | Kang et al. |
| 2009/0207653 | A1 | 8/2009 | Abraham et al. |

(Continued)

OTHER PUBLICATIONS

Lee et al., 2-Stack ID-1R Cross-point Structure with Oxide Diodes as Switch Elements for High Density Resistance RAM Applications, Semiconductor Device Laboratory, Samsung Advanced Institute of Technology, IEEE, 2007, pp. 771-774.

*Primary Examiner* — Tha-O H Bui
(74) *Attorney, Agent, or Firm* — TraskBritt (57) ABSTRACT Memory devices provide a plurality of memory cells, each memory cell including a memory element and a selection device. A plurality of first (e.g., row) address lines can be adjacent (e.g., under) a first side of at least some cells of the plurality. A plurality of second (e.g., column) address lines extend across the plurality of row address lines, each column address line being adjacent (e.g., over) a second, opposing side of at least some of the cells. Control circuitry can be configured to selectively apply a read voltage or a write voltage substantially simultaneously to the address lines. Systems including such memory devices and methods of accessing a plurality of cells at least substantially simultaneously are also provided.

20 Claims, 5 Drawing Sheets

Related U.S. Application Data continuation of application No. 13/430,970, filed on Mar. 27, 2012, now Pat. No. 9,025,370, which is a division of application No. 12/489,605, filed on Jun. 23, 2009, now Pat. No. 8,144,506.

(51) Int. Cl.
   *G11C 5/02* (2006.01)
   *G11C 8/10* (2006.01)
   *G11C 11/16* (2006.01)

(52) U.S. Cl.
   CPC .......... *G11C 13/003* (2013.01); *G11C 13/004* (2013.01); *G11C 13/0004* (2013.01); *G11C 13/0007* (2013.01); *G11C 13/0023* (2013.01); *G11C 2013/0054* (2013.01)

(58) Field of Classification Search
   CPC .......... G11C 13/003; G11C 5/02; G11C 8/10; G11C 11/16; G11C 2013/0054
   USPC .......................................................... 365/63
   See application file for complete search history.

(56) References Cited

U.S. PATENT DOCUMENTS

| | | |
|---|---|---|
| 2009/0267047 A1 | 10/2009 | Sasago et al. |
| 2009/0310402 A1 | 12/2009 | Parkinson |
| 2010/0117041 A1 | 5/2010 | Hwang et al. |
| 2010/0321988 A1 | 12/2010 | Wells et al. |
| 2012/0182787 A1 | 7/2012 | Wells et al. |
| 2015/0235699 A1 | 8/2015 | Wells et al. |

* cited by examiner

| Top | Bottom | Voltage Top-Bottom | Writes | Writes What | Off State Leakage |
|---|---|---|---|---|---|
| 0 | 0 | 0 | No | - | Very Low |
| 0 | Vo/2 | -Vo/2 | No | - | Low |
| 0 | Vo | -Vo | Yes | 0 | |
| Vo/2 | 0 | Vo/2 | No | - | Very Low |
| Vo/2 | Vo/2 | 0 | No | - | Very Low |
| Vo/2 | Vo | -Vo/2 | No | - | Low |
| Vo | 0 | Vo | Yes | 1 | |
| Vo | Vo/2 | Vo/2 | No | - | Low |
| Vo | Vo | 0 | No | - | Very Low |

FIG. 5

SEMICONDUCTOR MEMORY DEVICES INCLUDING A MEMORY ARRAY AND RELATED METHOD INCORPORATING DIFFERENT BIASING SCHEMES

CROSS-REFERENCE TO RELATED APPLICATIONS

This application is a continuation of U.S. patent application Ser. No. 14/702,330, filed May 1, 2015, now U.S. Pat. No. 9,361,979, issued May 7, 2016, which is a continuation of U.S. patent application Ser. No. 13/430,970, filed Mar. 27, 2012, now U.S. Pat. No. 9,025,370, issued May 5, 2015, which is a divisional of U.S. patent application Ser. No. 12/489,605, filed Jun. 23, 2009, now U.S. Pat. No. 8,144, 506, issued Mar. 27, 2012, the disclosure of each of which is hereby incorporated herein in its entirety by this reference.

TECHNICAL FIELD

Embodiments of the present disclosure relate generally to non-volatile memory. More particularly, embodiments of the present disclosure are directed to methods of reading and writing memory devices as well as to such memory devices.

BACKGROUND

Cross-point memories are memories that use intersecting address lines, such as row and column lines, with an intervening memory element. Examples of cross-point memories include magnetoresistive random access memory (MRAM), resistive random access memory (RRAM), ferroelectric random access memory (FRAM), silicon oxide nitride oxide semiconductor memory, polymer memory, and phase-change memory.

The memory element for conventional cross-point memories may be programmed by varying the voltage across the memory element (e.g., phase-change memory), or by varying the polarity of the voltage across the memory element (e.g., MRAM and some RRAM).

RRAM devices use resistive switching memory elements as an electronic memory. One type of RRAM memory element utilizes a material that may be, in one application, electrically switched between a first resistive value and a second resistive value based on the polarity of a current through the memory element. For example, a current pulsed though the memory element in a first polarity may cause the memory element to comprise a first resistive value representing a 1, while a current pulsed through the same memory element in a second, opposite polarity may cause the memory element to comprise a second resistive value representing a 0.

MRAM devices store information as an orientation of a magnetization. One type of MRAM memory element utilizes a magnetic tunnel junction (MJT). An MJT is typically formed from two ferromagnetic plates, each of which is configured to hold a magnetic field, separated by a thin insulating layer. One of the two plates is typically a permanent magnet set to a particular polarity, and the other plate is typically configured with a magnetic field that will change polarity to match that of an external field. A memory element may be written by passing a current through wires placed just above and below the MTJ element. A current in one polarity results in a magnetic field of the other plate in a particular polarity, while a current in the opposite polarity results in a magnetic field of the other plate that is opposite to the particular polarity.

DETAILED DESCRIPTION

The illustrations presented herein are, in at least some instances, not actual views of any particular cross-point memory device but are merely idealized representations which are employed to describe the present disclosure. Additionally, elements common between figures may retain the same numerical designation.

Figure 1:
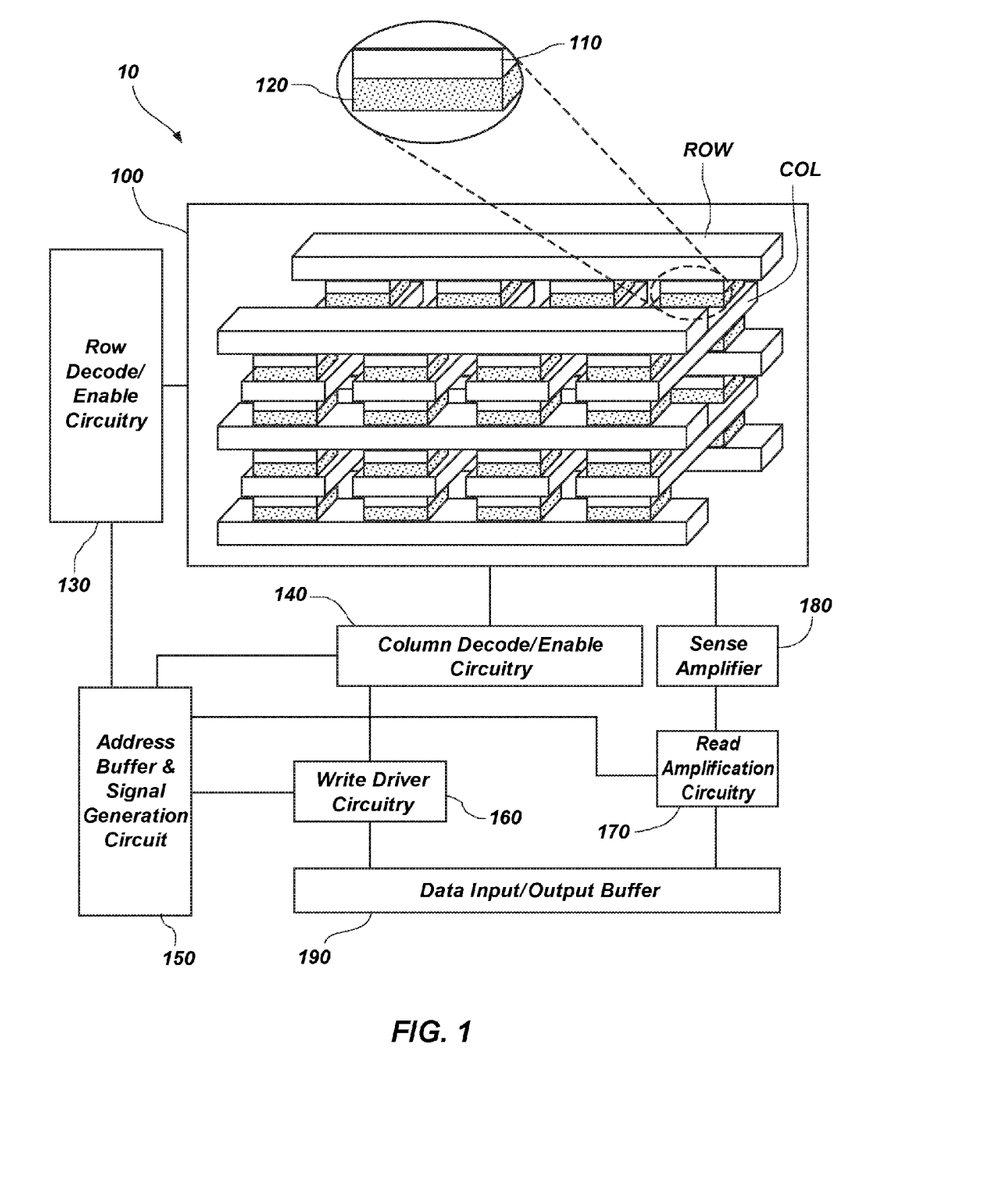
FIG. 1 illustrates a block diagram of a memory device according to some embodiments.

Various embodiments of the present disclosure are directed toward embodiments of a method for reading and writing to a plurality of memory cells at least substantially simultaneously. Referring to FIG. 1, a cross-point memory device 10 is depicted in accordance with at least one embodiment of the present disclosure. The memory device 10 may include cross-point memory 100 comprising a plurality of address lines extending in a first direction and a plurality of intersecting address lines (e.g., transverse). As used herein, first address lines extend in a first direction (e.g., across the figure), and may be respectively illustrated and referred to herein as rows, or row address lines, extending across the page. Meanwhile, as used herein, second address lines extend in a second direction (into and out of the figure), across the first address lines, and may be respectively illustrated and referred to herein as columns, or column address lines. Such terminology is intended only to aid in describing embodiments of the present disclosure and is not intended to be limiting. For example, first (e.g., row) address lines may be second (e.g., column) address lines, and vice versa, depending on the orientation of the memory array. Of course, varying numbers of address lines, including larger numbers or smaller numbers, may be provided according to various embodiments. Examples of such devices are described in U.S. Publication No. 2006/0120136, now U.S. Pat. No. 7,359,227, issued Apr. 15, 2008, as well as U.S. Pat. No. 6,882,553, issued Apr. 19, 2005. While an embodiment of a cross-point memory implemented as an RRAM device is illustrated, any other cross-point memory may be used in other embodiments of the present disclosure. By way of example and not limitation, the cross-point memory may be implemented as a MRAM, FRAM, PCRAM, or other memories that are known to those of ordinary skill in the art in which the memory cells may be configured into a cross-point array.

As depicted in FIG. 1, pairs of adjacent, intersecting address lines define at least one cell between them (also referred to herein as a "memory cell"). Each cell, as shown in the magnified portion of FIG. 1, may include a memory element 110 and a selection device 120. In other words, according to one or more embodiments, a row address line (e.g., Row 3 in FIGS. 2A-2D, 3A and 3B) is adjacent (e.g., extends under) at least a portion of a first side of a cell, and a column address line (e.g., one of Col. 1B, 2B, 3B, or 4 B in FIGS. 2A-3B) is adjacent (e.g., extends over) at least a portion of a second, opposing side of the cell.

The plurality of address lines are coupled to control circuitry configured to read or write the plurality of cells. For example, in the embodiment of FIG. 1, each row address line is electrically coupled to row decode/enable circuitry 130 that is configured to provide a respective voltage (including, e.g., a reference voltage, such as ground) to a plurality of row address lines in the array. Similarly, each column address line is electrically coupled to column decode/enable circuitry 140 that is configured to provide similar respective voltages to each column address line in the array. The memory device 10 further includes an address buffer and signal generation circuit 150, a write driver circuit 160, a read amplification circuit 170, a sense amplifier 180 and a data input/output buffer 190. The data input/output buffer 190 is configured to provide write data values to the write driver circuitry 160. A plurality of row address lines may be selected by the row decode/enable circuitry 130, and the write driver circuitry 160 may apply one or more reset pulses or set pulses to the plurality of column address lines selected by the column decode/enable circuitry 140. Various configurations for applying the one or more reset pulses or set pulses to the plurality of column address lines to store the plurality of data values in multiple memory cells are described in more detail below.

In at least some embodiments, the memory element 110 may comprise a resistive changing material suitable for non-volatile memory data storage. The resistive changing material may be a material having electrical properties (e.g., resistance) that may be changed through the application of energy such as, for example, heat, light, voltage potential, or electrical current. By way of example and not limitation, suitable resistive changing materials may include a phase-change or ionic conducting chalcogenide material, a binary metal oxide material, a perovskite oxide material, a colossal magnetoresistive material, or a polymer material.

By way of further example and not limitation, a phase-change chalcogenide material may comprise doped or undoped $Ge_2Sb_2Te_5$ or $Sb_2Te_3$. An ionic conducting chalcogenide material may comprise Ag-doped GeSe or GeS. A binary metal oxide material may comprise $HfO_x$, $Nb_2O_5$, $Al_2O_3$, $WO_x$, $Ta_2O_5$, $TiO_x$, $ZrO_x$, $Cu_xO$ or $Ni_xO$. A perovskite oxide material may comprise doped or undoped $SrTiO_3$, $SrZrO_3$, or $BaTiO_3$. A colossal magnetoresistive material may comprise $Pr_{(1-x)}Ca_xMnO_3$ (PCMO), $La_{(1-x)}Ca_xMnO_3$ (LCMO), or $Ba_{(1-x)}Sr_xTiO_3$. A polymer material may comprise $Alq_3Ag$, Cu-TCNQ, DDQ, TAPA, or a fluorescine-based polymer. One of ordinary skill in the art will recognize that other materials may be suitable. Thus, the scope of the present disclosure is not limited to just these materials.

In at least some embodiments, the selection device 120 may comprise a material that does not change phase, but remains permanently amorphous and its current-voltage characteristics may remain at least substantially the same throughout its operating life. By way of example and not limitation, the selection device 120 may comprise As—Te—I, $TiAs(Se, Te)_2$, Si—Te—As—Ge, Si—Te—As—Ge—P, Al—As—Te, Al—Ge—As—Te, $Te_{39}As_{36}Si_{17}Ge_7P_1$, although the scope of embodiments of the present disclosure is not limited to just these materials. In other embodiments, the selection device 120 may comprise a material that possesses bipolar rectification properties.

When an appropriate potential is applied between adjacent, intersecting address lines (e.g., Row 3 and Col. 4B in FIG. 2A), a selection device 120 between the intersecting address lines turns on, allowing current flow across a memory element 110. Thus, it may be understood that shared address lines are utilized. Namely, address lines can be shared between an overlying cell and an underlying cell. For example, with reference to FIG. 2A, column address line Col. 1A is shared between overlying cells including the memory element 110A and the selection device 120A and underlying cells including the memory element 110E and the selection device 120E. Similarly, the row address line Row 2 functions for selection of its overlying cells, including the memory elements 110E-110H and the selection devices 120E-120H, as well as for selection of its underlying cells, including the memory elements 110I-110L and the selection devices 120I-120L. As a result, considerable economies may be achieved in some embodiments of the present disclosure, in terms of cost, size and speed.

In one or more embodiments, a voltage biasing system is used such that address lines can be shared. In particular, a read or write voltage may be applied to one or more address lines. For example, referring to FIG. 2A, a read or write voltage may be applied to a row address line, such as Row 2. One or more columns may be selected by providing a reference voltage, such as ground, on the appropriate column address lines. For example, column address lines Col. 1A and Col. 3A, located above Row 2, and Col. 1B and Col. 2B, located below Row 2, may be grounded (e.g., by biasing those lines to 0V). Similarly, a read or write voltage may be applied to a column address line, such as column address lines Col. 4A, Col. 3B and Col. 4B, while a row address line, such as row address lines Row 1 and Row 3, are grounded. In such an embodiment, cells made up of the selection devices 120D, 120E, 120G, 120I, 120J, 120O and 120P and the memory elements 110D, 110E, 110G, 110I, 110J, 110O and 110P will be selected for reading or writing thereto.

In embodiments in which the memory element is a non-volatile, bipolar switching material (e.g., a conventional bipolar binary oxide), the memory element may be programmed into one of at least two memory states by applying an electrical signal to the memory material, the electrical signal having one of two opposing polarities referred to herein as positive or negative. A positive or negative electrical signal may change the resistance of the memory material between a relatively high resistance state and a relatively low resistance state. Programming of the memory element to change the resistance of the material may be accomplished by applying different voltages to respective crossing address lines, thereby generating a voltage potential across the memory material in a particular polarity.

The information stored in the memory elements 110 may be read by measuring the resistance of the memory material. As an example, a read current may be provided to the memory material using crossing address lines, such as Row 1 and Col. 1A, and a resulting read voltage across the memory material may be compared against a reference voltage using, for example, a sense amplifier (not shown). The read voltage may be proportional to the resistance exhibited by the memory material.

In a low-voltage or low-field regime, the selection device 120 is off and may exhibit very high resistance in some embodiments. The off resistance can, for example, range from 50,000 ohms to greater than 10 gigaohms at a bias of half the threshold voltage. The selection devices 120 may remain in the off state until a threshold voltage or threshold current switches the selection device 120 to a highly conductive, low resistance on state. The voltage across the selection device 120 after it is turned on may drop to a slightly lower voltage, called the holding voltage and may remain very close to this holding voltage. By way of example and not limitation, the threshold voltage may be on the order of about 1.1 volts and the holding voltage may be on the order of about 0.9 volt.

In the on state, the selection device 120 voltage drop remains close to the holding voltage as the current passing through the device is increased up to a certain, relatively high, current level. Above that current level the device remains on but displays a finite differential resistance with the voltage drop increasing with increasing current. The selection device 120 may remain on until the current through the selection device 120 is dropped below a characteristic holding current value that is dependent on the area of the material and may be impacted by top and bottom electrodes utilized to form the selection device 120.

In at least some embodiments, the memory elements 110 may be configured to store a 1 when a voltage across a respective memory element 110 and selection device 120 is positive voltage $V_o$, and to store a 0 when the voltage across a respective memory element 110 and selection device 120 is a negative voltage $-V_o$. As used herein, voltage $V_o$ comprises a voltage sufficient to switch the selection device 120 to the on state and to change the resistance of the memory element 110. In each of the embodiments shown in FIGS. 2A-3B, and by way of example and not limitation, the memory elements 110 and selection devices 120 are configured such that a positive voltage $V_o$ alters the memory element 110 to a high resistance, while a negative voltage $-V_o$ alters the memory element 110 to a low resistance. Furthermore, the embodiments described herein with reference to FIGS. 2A-3B also illustrate, by way of example and not limitation, embodiments wherein the voltage applied is considered positive when the upper conductor of a respective memory element 110 and section device 120 (as oriented in the FIGS.) is a higher voltage than the lower conductor, and negative when the lower conductor is a higher voltage than the upper conductor.

Figure 5:
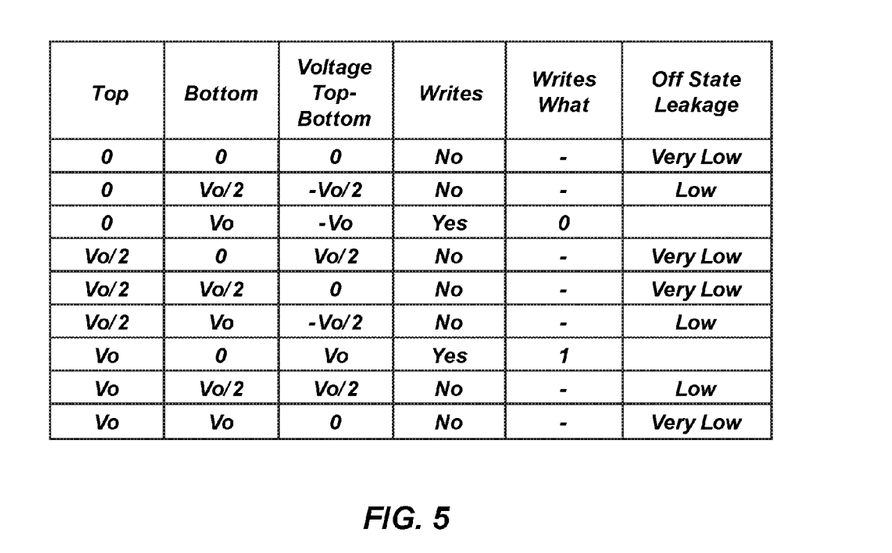
FIG. 5 is a truth table showing the various possible voltages to a memory element and respective selection device, as well as the written value according to at least one embodiment.

FIG. 5 is a truth table showing the various possible voltages to a memory element 110 and respective selection device 120, as well as the resulting change, if any, to the memory element 110. As shown, when a voltage of 0V is applied to both the upper conductor (referred to as "top" in FIG. 5) and the lower conductor (referred to as "bottom" in FIG. 5), the voltage from top to bottom is 0V and nothing is written to the respective memory element 110. When the voltage at the upper conductor is 0V and the voltage at the lower conductor is $\frac{1}{2}V_o$, the voltage from top to bottom is $-\frac{1}{2}V_o$ and nothing is written to the respective memory element 110. When the voltage is 0V at the upper conductor and a voltage $V_o$ is applied to the lower conductor, the resulting voltage from top to bottom is $-V_o$, resulting in a 0 being written to the respective memory element 110. When a voltage of $\frac{1}{2}V_o$ is applied to the upper conductor, nothing is written to the respective memory element 110, since a voltage of 0V on the lower conductor results in $\frac{1}{2}V_o$ from top to bottom, a voltage of $\frac{1}{2}V_o$ on the lower conductor results in 0V from top to bottom, and a voltage of $V_o$ on the lower conductor results in $-\frac{1}{2}V_o$ from top to bottom. When the voltage at the upper conductor is $V_o$ and a voltage of 0V is applied to the lower conductor, the resulting voltage from top to bottom is $V_o$, resulting in a 1 being written to the respective memory element 110. In the remaining two cases, when a voltage of $V_o$ is applied to the upper conductor, a voltage of $\frac{1}{2}V_o$ on the lower conductor results in $\frac{1}{2}V_o$ from top to bottom and a voltage of $V_o$ on the lower conductor results in 0V from top to bottom, both cases resulting in nothing being written to the respective memory element 110.

Figure 2A:
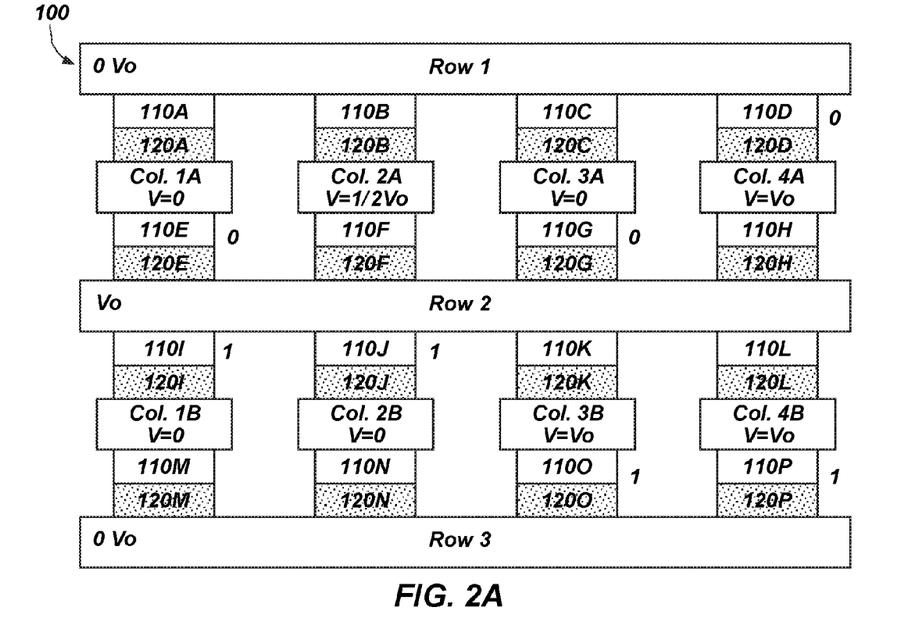
FIGS. 2A-2D illustrate a schematic depiction of at least one embodiment of at least a portion of a single plane in a memory array.

For example, a 1 may be written to each memory element 110I and 110J in the embodiment illustrated in FIG. 2A when the row address line Row 2 is biased at voltage $V_o$ and the column address lines Col. 1B and Col. 2B are grounded. Similarly, a 1 may be written to each memory element 110O and 110P when the row address line Row 3 is grounded and the column address lines Col. 3B and Col. 4B are biased at voltage $V_o$.

Furthermore, the memory elements 110 may be configured to store a 0 when a voltage across a respective memory element and selection device is $-V_o$. For example, row address line Row 1 or Row 3, or both, may be grounded. One or more columns may be selected by applying a voltage $V_o$ to the appropriate column address line. For example, a voltage $V_o$ may be applied to the column address lines Col. 1A, Col. 3A and Col. 4A. In such an embodiment, cells made up of the selection devices 120D, 120E and 120G and the memory elements 110D, 110E and 110G will be selected with a $-V_o$, resulting in a 0 being written to each memory element 110D, 110E and 110G.

At the same time, unselected address lines, such as the column address line Col. 2A, may be biased at a voltage less than the read or write voltage and greater than the reference voltage. By way of example and not limitation, unselected address lines may be biased at half the write voltage (i.e., one-half $V_o$) such that the potential across cells of the unselected address lines (e.g., selection devices 120B and 120F and memory elements 110B and 110F in FIG. 2A) is a positive or negative one-half $V_o$. In this manner, the potential across unselected cells is either zero (e.g., in the case of selection devices 120A, 120C, 120H, etc., and memory elements 110A, 110C, 110H, etc., in FIG. 2A) or positive or negative one-half $V_o$ (e.g., in the case of selection devices 120B and 120F and memory elements 110B and 110F in FIG. 2A). The selection devices may be configured such that the half voltage is insufficient to turn on the selection devices 120 resulting in no current flow or relatively low current flow across a cell, the memory elements 110 may be configured such that the half voltage is insufficient to change the resistance of the memory element, or a combination thereof.

This configuration allows for multiple memory elements 110 to be written to or read at least substantially simultaneously. In some embodiments, at least a quarter of a page may be written in a single clock cycle. In some embodiments, a word may be written in no more than two clock cycles. Thus, as will be seen, a reduction in clock cycles and, therefore, time for writing or reading memory elements 110 is provided. FIG. 2A is a schematic depiction of at least one embodiment of at least a portion of a single plane in a memory array. As used herein, a "single plane" in the memory array includes each of the first address lines extending parallel to each other and located in a common vertical plane of the memory array. For example, in the embodiment set forth in FIG. 2A with the row address lines Row 1 and Row 3 grounded, and a write voltage $V_o$ applied to row address line Row 2, one or more of column address lines Col. 1A through Col. 4B may be selected and pulsed simultaneously with voltages of 0V or $V_o$ to write a 1 or 0 value to at least some of the memory elements 110, as described herein above. Thus, in the example shown in FIG. 2A, a total of 7 bits are written in a single clock cycle.

Figure 2B:
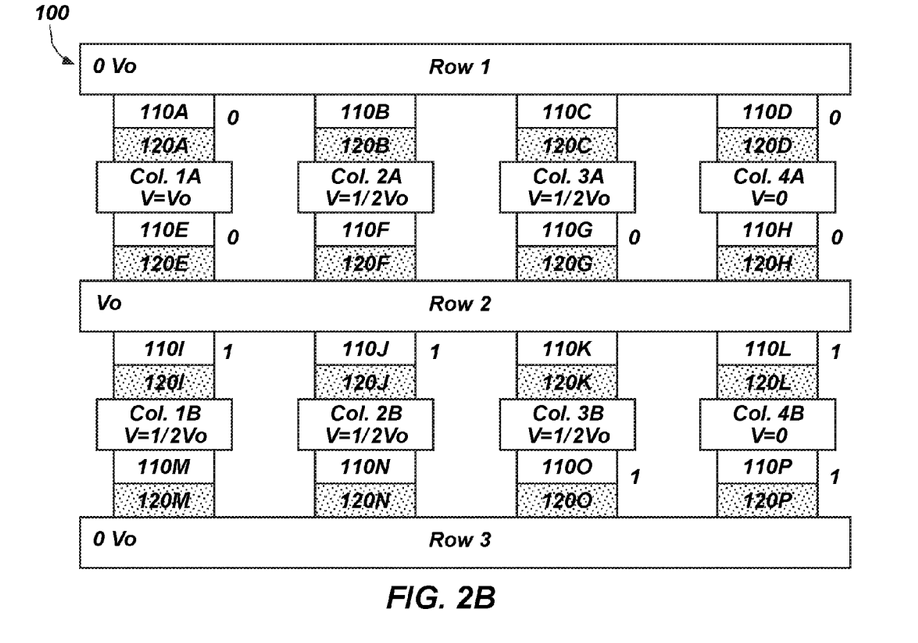

FIG. 2B illustrates the cross-point memory 100 of FIG. 2A after the memory elements 110 described above have been written. Subsequent to writing the memory elements 110 described above, it may be desired to write to memory elements 110 on the opposing side of at least some of the address lines. For example, it may be desired to write a 1 to memory element 110L, as well as to write a 0 to memory elements 110A and 110H. Thus, as shown in FIG. 2B, a voltage $V_o$ may be applied to the column address line Col. 1A, and the column address lines Col. 4A and Col. 4B may be grounded. In order to protect the remaining memory elements 110, a voltage of one-half $V_o$ may be applied to column address lines Col. 2A, Col. 3A, Col. 1B, Col. 2B and Col. 3B.

Figure 2C:
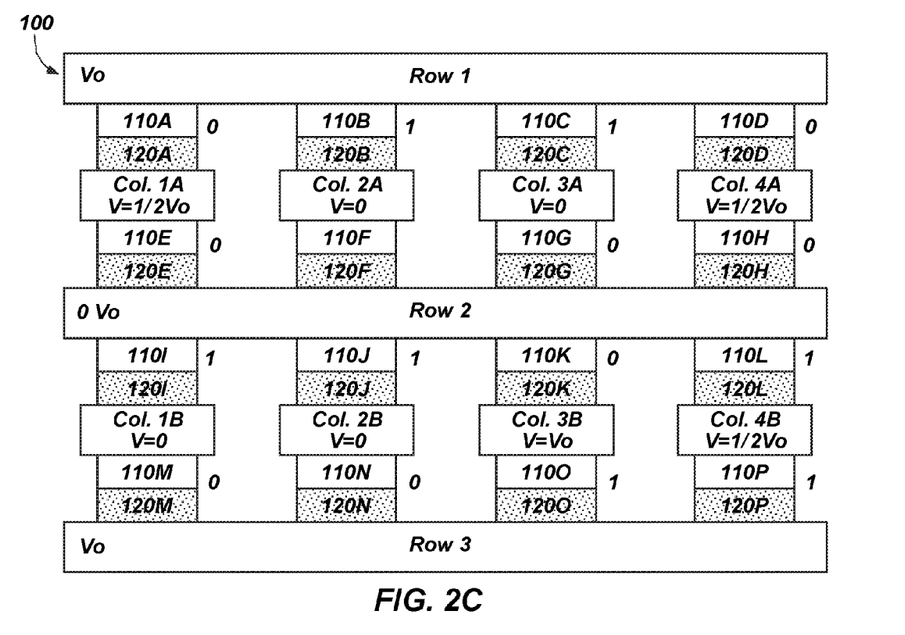

FIG. 2C illustrates the cross-point memory 100 of FIGS. 2A and 2B after the memory elements 110 have been written as described with reference to FIG. 2B. In FIG. 2C, subsequent to writing the memory elements 110 described above with reference to FIGS. 2A and 2B, the row address lines Row 1 -Row 3 may have opposite voltages applied thereto. As illustrated, row address lines Row 1 and Row 3 may have voltage $V_o$ applied thereto, while row address line Row 2 may be grounded. The voltage levels applied to column address lines Col. 1A through Col. 4B depends on the desired value written to the memory elements 110 not yet containing a value. By way of example and not limitation, a value of 1 might be desired to be written to memory elements 110B and 110C, and a value of 0 might be desired to be written to memory element 110M, 110N and 110K. In such a case, as shown in FIG. 2C, a voltage $V_o$ may be applied to the column address line Col. 3B and column address lines Col. 2A, Col. 3A, Col. 1B and Col. 2B may be grounded. In order to protect the remaining memory elements 110, a voltage of one-half $V_o$ may be applied to column address lines Col. 1A, Col. 4A and Col. 4B.

Figure 2D:
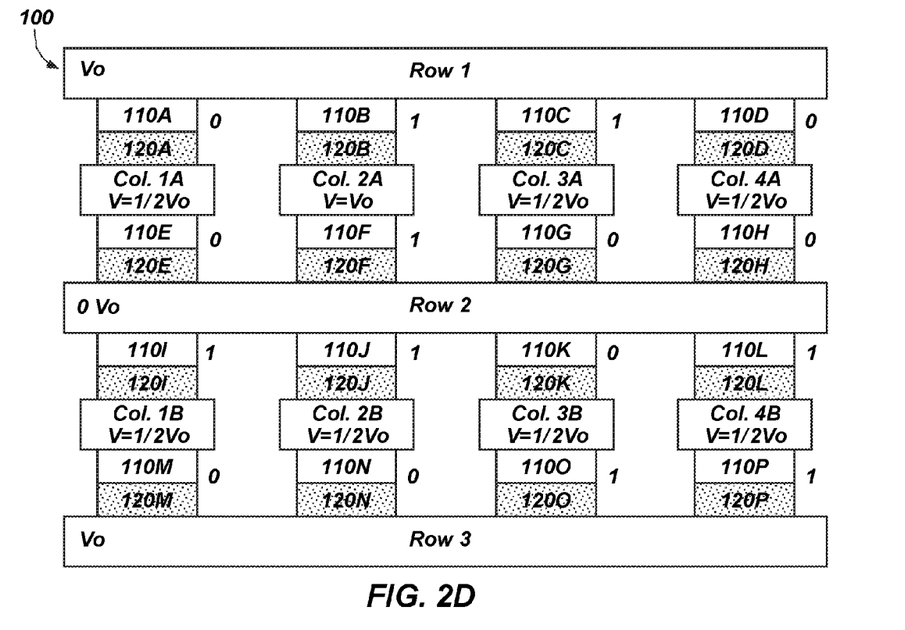

To complete the page illustrated in FIGS. 2A-2D, the last remaining memory element 110F may have a 1 written thereto, for example. In such a case, as illustrated in FIG. 2D, a voltage $V_o$ may be applied to column address line Col. 2A while a voltage of one-half $V_o$ may be applied to all the remaining column address lines Col. 1A, Col. 3A, Col. 4A, Col. 1B, Col. 2B, Col. 3B and Col. 4B in order to protect the associated memory elements 110. In such a manner, the entire page illustrated in FIGS. 2A-2D may be written to in just a few clock cycles.

Figure 3A:
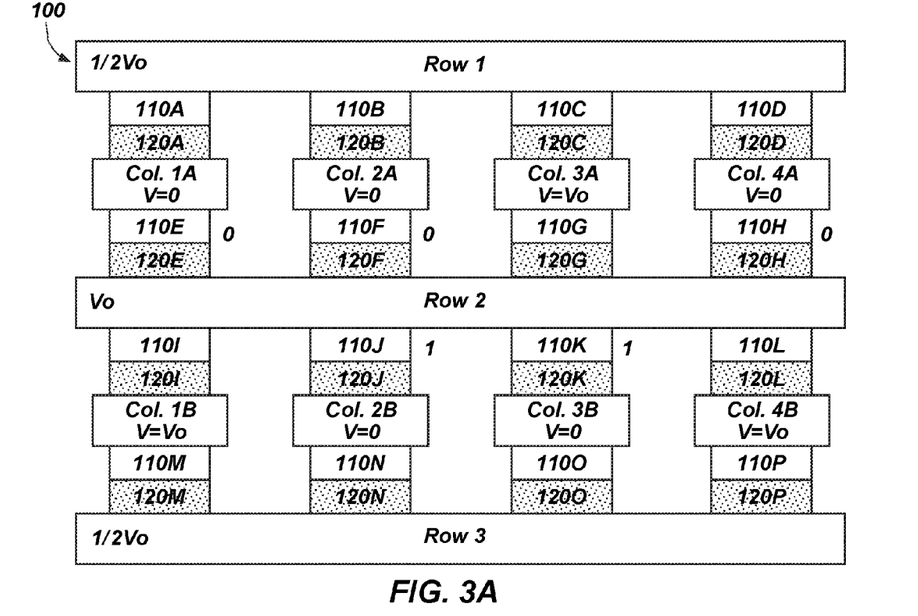
FIGS. 3A and 3B are a schematic depiction of at least one embodiment of a portion of a single plane in a memory array.

In at least one other embodiment, a cross-point memory 100 may be configured to read/write a full word in only two clock cycles. By way of example and not limitation, FIG. 3A illustrates an embodiment cross-point memory 100 configured to read/write a word comprising 8 bits. As illustrated, row address line Row 2 may have a voltage $V_o$ applied thereto while row address lines Row 1 and Row 3 may have a voltage one-half $V_o$ applied thereto. If, for example, an eight-bit word comprises 00100110, a first plurality of data may be written at least substantially simultaneously and a second, remaining plurality of data may be written at least substantially simultaneously. By way of example and not limitation, with a voltage $V_o$ applied to row address line Row 2 , column address line Col. 1A, Col. 2A, Col. 4A, Col. 2B and Col. 3B may be grounded. Upon pulsing the voltage values to the column address lines, each of memory elements 110J and 110K will have a value of 1 written thereto and each of memory elements 110E, 110F and 110H will have a 0 written thereto. Each of the remaining column address lines Col. 3A, Col. 1B and Col. 4B may have either a voltage $V_o$ applied thereto or a voltage one-half $V_o$ applied thereto to protect their corresponding memory elements 110 from being enabled.

Figure 3B:
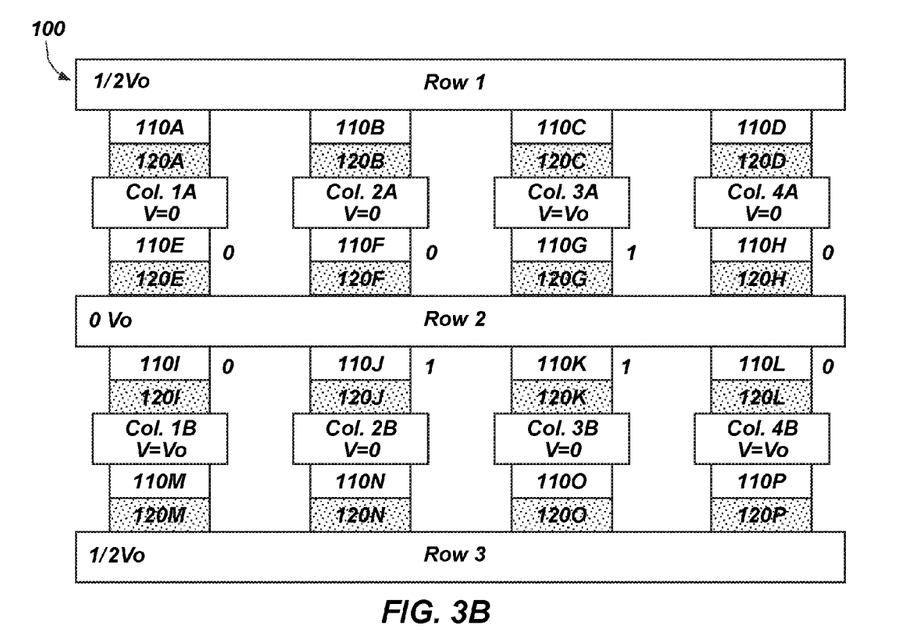

FIG. 3B illustrates the cross-point memory 100 of FIG. 3A subsequent to writing the first plurality of data as described above. Row address line Row 2 may be grounded while the one-half $V_o$ voltage is still applied to row address lines Row 1 and Row 3 . To write a value of 1 to memory element 110G and a 0 value to memory elements 110I and 110L, a voltage $V_o$ is applied to column address lines Col. 3A, Col. 1B and Col. 4B. Each of the remaining column address lines Col. 1A, Col. 2A, Col. 4A, Col. 2B and Col. 3B may either be grounded or have a voltage of one-half $V_o$ applied thereto to protect their corresponding memory elements 110 from being enabled.

The example provided herein with reference to FIGS. 3A and 3B describe the column address lines being pulsed to write to respective memory elements 110. However, this is not intended to be limiting. Indeed, in other embodiments, the row address lines may be pulsed after a particular voltage is applied to the respective column address lines. Thus, for example, in the embodiment described in FIGS. 3A and 3B, the respective voltages may be applied to each of the column address lines. A voltage $V_o$ may be pulsed on row address line Row 2 followed by grounding the same row address line Row 2 . In such an embodiment, it may not be necessary to change the voltages applied to the column address lines.

As described, an 8-bit word may be written to a plurality of memory elements 110 in just a couple of clock cycles and in close proximity in the cross-point memory array. Furthermore, as will be apparent to those of ordinary skill in the art, by providing a memory array with a greater number of cells comprising a selection device 120 and a memory element 110, a system employing larger word sizes (e.g., 16 bit, 32 bit, etc.) may similarly be written such that at least one word may be read/written in a minimum number of clock cycles.

Figure 4:
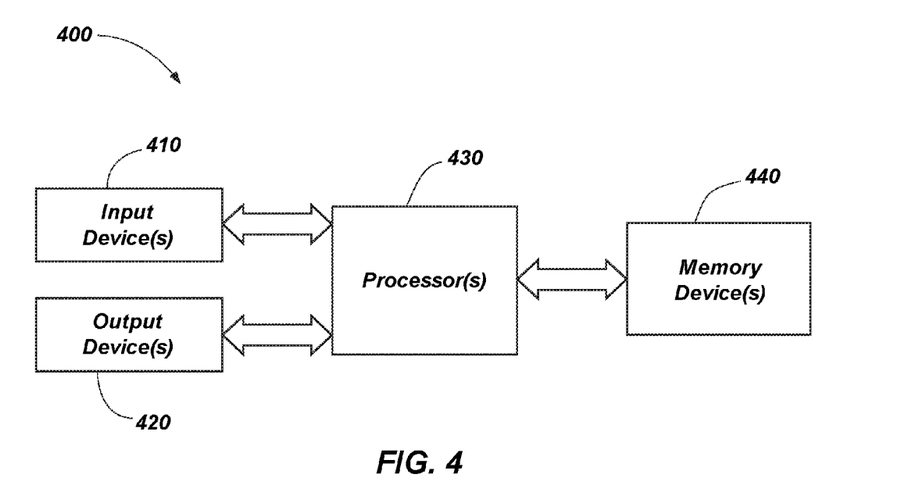
FIG. 4 is a schematic of a computing system diagram showing at least one semiconductor memory device containing at least one cross-point memory device according to at least one embodiment of the present disclosure.

Still additional embodiments of the present disclosure are directed to electronic systems comprising cross-point memory devices. As shown in FIG. 4, an electronic system 400, such as a computer system, in accordance with an embodiment of the present disclosure, comprises at least one input device 410, at least one output device 420, at least one memory access device, such as processor 430, and at least one memory device 440. As used herein, the term "computer system" includes not only computers, such as personal computers and servers, but also wireless communications devices (e.g., cell phones, personal digital assistants configured for text messaging and email), cameras, chip sets, set top boxes, controllers, vehicle and engine control and sensor systems, digital music players, and other combinations of the above-referenced input, output, processor and memory devices. The at least one memory device 440 comprises at least one cross-point memory device (e.g., device 100) comprising a plurality of memory cells having a memory element coupled to a selection device.

CONCLUSION

Various embodiments of the present disclosure are described above and comprise methods for at least substantially simultaneously accessing a plurality of cross-point memory cells. In one or more embodiments, such methods may comprise biasing a plurality of first address lines and biasing a plurality of second address lines. Each first address line of the plurality may be adjacent a first side of some of a plurality of cells in a single plane of a three-dimensional array of cells. Each cell may comprise a memory element and a selection device. The plurality of second address lines may extend across the plurality of first address lines. Each second address line may extend over a second, opposing side of at least one cell of the plurality of cells in the single plane of the three-dimensional array of cells such that a plurality of cells in the single plane of the array of cells are accessed at least substantially simultaneously and at least one cell of the plurality of cells in the single plane is not accessed.

In other embodiments, methods of storing a plurality of data values into a selected portion of memory cells in a common plane of a three-dimensional memory array may comprise biasing at least one first address line extending in first direction. At least one side of each of a plurality of cells in the common plane may be adjacent to at least one of the first address lines, each cell comprising a memory element and a selection device. A plurality of second address lines extending across the at least one first address line may be biased. Each second address line may be adjacent a side of a cell of the plurality of cells opposite the side of the cell adjacent to a respective one of the at least one first address lines. At least some of the plurality of data values may be stored at least substantially simultaneously in at least some of the plurality of cells.

In still other embodiments, methods of at least substantially simultaneously writing to a plurality of memory cells may comprise selectively applying a reference voltage to at least one first address line in a plane. Each of the at least one first address lines may be adjacent to a first side of some of a plurality of cells comprising a memory element and a selection device. A write voltage or a voltage less than the write voltage and greater than the reference voltage may be selectively applied to at least one other first address line located in the plane and adjacent to the at least one first address line. The write voltage or the reference voltage may be selectively applied to a plurality of second address lines extending across the at least one first address line. Each second address line of the plurality of second address lines may be adjacent to a second, opposing side of a respective cell of the plurality of cells.

In other embodiments a memory device may comprise a plurality of cells, each cell comprising a memory element and a selection device. A plurality of first address lines may be adjacent a first side of at least some cells of the plurality of cells. A plurality of second address lines may extend across to the plurality of first address lines, and each second address line may be adjacent a second, opposing side of at least some cells of the plurality of cells. Control circuitry may be configured to selectively apply a write voltage or a reference voltage at least substantially simultaneously to the plurality of first address lines and to selectively apply a write voltage, a reference voltage, or a voltage less than the write voltage and greater than the reference voltage at least substantially simultaneously to the plurality of second address lines.

In still other embodiments, an electronic system may comprise a memory access device and a memory device coupled thereto. The memory device may comprise a plurality of memory cells in a common plane. Each memory cell may comprise a memory element coupled to a selection device. A first address line of a plurality of first address lines may be adjacent a first side of at least some cells of the plurality of cells. A plurality of second address lines may extend across the plurality of first address lines. Each second address line may be adjacent a second, opposing side of at least some cells of the plurality of cells. A first decode/enable circuitry may be configured to selectively apply a write voltage or a reference voltage to the first address lines. A second decode/enable circuitry may be configured to selectively apply a write voltage, a reference voltage, or a voltage less than the write voltage and greater than the reference voltage to at least some of the plurality of second address lines such that at least some of the plurality of memory cells are accessed at least substantially simultaneously.

Although the embodiments described herein are directed to cross-point memories configured for bipolar switching (e.g., RRAM, MRAM), other memory may be configured for monopolar switching (e.g., PCRAM). In such embodiments, the biasing schemes described above may need to be modified slightly to protect specific cells. For example, in some monopolar switching embodiments, the value written to a memory cell may depend on the magnitude of the voltage, the length of the pulse, or both through the memory cell. Accordingly, in at least some monopolar embodiments, the memory material may be adapted to be altered such that it can be in any particular one of a number of resistance states so as to provide digital or analog storage of information. In any of the various bipolar or monopolar embodiments, it will be apparent to one of ordinary skill in the art that a plurality of cells may be simultaneously accessed by properly biasing the plurality of row address lines and the plurality of column address lines, similar to the manner described herein.

Therefore, while certain embodiments have been described and shown in the accompanying drawings, such embodiments are merely illustrative and not restrictive of the scope of the invention, and this invention is not limited to the specific constructions and arrangements shown and described, since various other additions and modifications to, and deletions from, the described embodiments will be apparent to one of ordinary skill in the art. Thus, the scope of the invention is only limited by the literal language, and legal equivalents, of the claims which follow.

What is claimed is:

1. A semiconductor memory device including a memory array, comprising:
   address lines including a first row address line, a second row address line, a third row address line, and a fourth row address line;
   column address lines including a first column address line and a second column address line;
   a first memory cell coupled between the first column address line and the first row address line;
   a second memory cell coupled between the first column address line and the second row address line;
   a third memory cell coupled between the second column address line and the third row address line;
   a fourth memory cell coupled between the second column address line and the fourth row address line; and
   a voltage biasing system operably coupled with the row address lines and the column address lines, and configured to selectively apply voltages to the row address lines and the column address lines according to a bias scheme that causes either the first memory cell or the second memory cell to be accessed within a same clock cycle as either the third memory cell or the fourth memory cell.

2. The semiconductor memory device of claim 1, wherein each memory cell is configured as at least one of a magnetoresistive random access memory (MRAM) cell, a resistive random access memory (RRAM) cell, a ferroelectric random access memory (FRAM) cell, or a phase change random access memory (PCRAM) cell.

3. The semiconductor memory device of claim 1, wherein each memory cell includes a memory element and a selection device.

4. The semiconductor memory device of claim 3, wherein the memory element includes a resistive changing material selected from the group consisting of a phase-change conducting chalcogenide material, an ionic conducting chalcogenide material, a binary metal oxide material, a perovskite oxide material, a colossal magnetoresistive material, and a polymer material.

5. The semiconductor memory device of claim 4, wherein:
the phase-change conducting chalcogenide material includes at least one of doped or undoped $Ge_2Sb_2Te_5$ or $Sb_2Te_3$;
the ionic conducting chalcogenide material includes at least one of Ag-doped GeSe or GeS;
the binary metal oxide material includes at least $HfO_x$, $Nb_2O_5$, $Al_2O_3$, $WO_x$, $Ta_2O_5$, $TiO_x$, $ZrO_x$, $Cu_xO$ or $Ni_xO$;
the perovskite oxide material includes at least one of doped or undoped $SrTiO_3$, $SrZrO_3$, or $BaTiO_3$;
the colossal magnetoresistive material includes at least one of $Pr_{(1-x)}Ca_xMnO_3$ (PCMO), $La_{(1-x)}Ca_xMnO_3$ (LCMO), or $Ba_{(1-x)}Sr_xTiO_3$; and
the polymer material includes at least one of $Alq_3Ag$, Cu-TCNQ, DDQ, TAPA, or a fluorescine-based polymer.

6. The semiconductor memory device of claim 3, wherein the selection device includes an amorphous material exhibiting current-voltage characteristics that are substantially the same throughout its operating life.

7. The semiconductor memory device of claim 6, wherein the amorphous material includes at least one of As—Te—I, TiAs(Se, Te)$_2$, Si—Te—As—Ge, Si—Te—As—Ge—P, Al—As—Te, Al—Ge—As—Te, or $Te_{39}As_{36}Si_{17}Ge_7P_1$.

8. A semiconductor memory device including a memory array, comprising:
a first row address line, a second row address line, and a third row address line extending in a first direction;
a first set of column address lines located between the first row address line and the second row address line, and extending in a second direction transverse to the first direction;
a second set of column address lines located between the second row address line and the third row address line, and extending parallel in the second direction;
a page of memory cells including:
a first word of memory cells located in a first plane between the first row address line and the first set of column address lines;
a second word of memory cells located in a second plane between the first set of column address lines and the second row address line;
a third word of memory cells located in a third plane between the second row address line and the second set of column address lines; and
a fourth word of memory cells located in a fourth plane between the second set of column address lines and the third row address line; and
a voltage biasing system operably coupled to the row address lines and the column address lines, and configured to access at least one memory cell from the first word or the second word within a same clock cycle as at least one memory cell from either the third word or the fourth word.

9. The semiconductor memory device of claim 8, wherein the voltage biasing system is further configured to access at least a quarter of the page within a single clock cycle.

10. The semiconductor memory device of claim 8, wherein the voltage biasing system is further configured to access at least an entire word within two clock cycles.

11. The semiconductor memory device of claim 8, wherein the voltage biasing system is further configured to access the entire page within four clock cycles.

12. A method of operating a semiconductor memory device comprising a three-dimensional memory array, the method comprising:
accessing at least one memory cell from a first word of memory cells or a second word of memory cells of a page of memory cells, the first word of memory cells located in a first plane between a first row address line and a first set of column address lines, the second word of memory cells located in a second plane between the first set of column address lines and a second row address line; and
accessing at least one additional memory cell from a third word of memory cells or a fourth word of memory cells of the page of memory cells during a first clock cycle as accessing the at least one memory cell, the third word of memory cells located in a third plane between the second row address line and a second set of column address lines, and the fourth word of memory cells located in a fourth plane between the second set of column address lines and a third row address line, wherein:
the first row address line, the second row address line, and the third row address line extend in a first direction;
the first set of column address lines is located between the first row address line and the second row address line, and extends in a second direction transverse to the first direction; and
the second set of column address lines is located between the second row address line and the third row address line, and extends in the second direction.

13. The method of claim 12, wherein accessing includes applying different voltages to the first row address line, the second row address line, the third row address line, the first set of column address lines, and the second set of column address lines to access at least a quarter of the page within a single clock cycle.

14. The method of claim 12, wherein accessing includes applying different voltages to the first row address line, the second row address line, the third row address line, the first set of column address lines, and the second set of column address lines to access at least an entire word within two clock cycles.

15. The method of claim 12, wherein accessing includes applying different voltages to the first row address line, the second row address line, the third row address line, the first set of column address lines, and the second set of column address lines to access the entire page within four clock cycles.

16. The method of claim 12, wherein accessing includes applying different voltages to the first row address line, the second row address line, the third row address line, the first set of column address lines, and the second set of column address lines by at least one of pulsing the first set and second set of column address lines or pulsing the row address lines to write to the respective memory cells.

17. The method of claim 12, wherein accessing includes:
applying a reference voltage to the first row address line;
applying a write voltage to the second row address line;
applying the reference voltage to the third row address line; and applying a combination of either the write voltage, the reference voltage, or an intermediate voltage to the different column address lines of the first and second set of column address lines during the first clock cycle, wherein the intermediate voltage is a voltage between the write voltage and the reference voltage.

18. The method of claim 17, further comprising accessing additional memory cells by:
applying the write voltage to the first row address line;
applying the reference voltage to the second row address line;
applying the write voltage to the third row address line; and
applying a combination of either the write voltage, the reference voltage, or the intermediate voltage to the different column address lines of the first and second set of column address lines during a second clock cycle.

19. The method of claim 12, wherein accessing includes:
applying an intermediate voltage to the first row address line;
applying a reference voltage to the second row address line;
applying the intermediate voltage to the third row address line; and
applying a combination of either the write voltage, the reference voltage, or an intermediate voltage to the different column address lines of the first and second set of column address lines during the first clock cycle, wherein the intermediate voltage is a voltage between the write voltage and the reference voltage.

20. The method of claim 19, further comprising accessing additional memory cells by:
applying the reference voltage to the first row address line;
applying the intermediate voltage to the second row address line;
applying the reference voltage to the third row address line; and
applying a combination of either the write voltage, the reference voltage, or the intermediate voltage to the different column address lines of the first and second set of column address lines during a second clock cycle.

* * * * *

UNITED STATES PATENT AND TRADEMARK OFFICE
CERTIFICATE OF CORRECTION

PATENT NO. : 9,715,929 B2
APPLICATION NO. : 15/165800
DATED : July 25, 2017
INVENTOR(S) : David H. Wells and Jun Liu Page 1 of 1

It is certified that error appears in the above-identified patent and that said Letters Patent is hereby corrected as shown below:

In the Specification

Column 3,   Line 3,    change "or 4 B" to --or 4B--
Column 6,   Line 25,   change "Col. 2 A," to --Col. 2A,--

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*